United States Patent
Huang et al.

(10) Patent No.: US 8,362,558 B2
(45) Date of Patent: Jan. 29, 2013

(54) LOW ON-RESISTANCE LATERAL DOUBLE-DIFFUSED MOS DEVICE

(75) Inventors: Hsueh-I Huang, Hsinchu (TW);
Chien-Wen Chu, Hsinchu (TW);
Cheng-Chi Lin, Hsinchu (TW);
Shih-Chin Lien, Hsinchu (TW);
Chin-Pen Yeh, Hsinchu (TW);
Shyi-Yuan Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 13/100,449

(22) Filed: May 4, 2011

(65) Prior Publication Data
US 2011/0204441 A1 Aug. 25, 2011

Related U.S. Application Data

(62) Division of application No. 11/767,205, filed on Jun. 22, 2007, now Pat. No. 8,017,486.

(51) Int. Cl.
*H01L 29/02* (2006.01)

(52) U.S. Cl. ........ 257/345; 257/355; 257/328; 257/360; 257/173; 257/E29.012; 438/142; 438/197; 438/218; 438/221; 438/225

(58) Field of Classification Search .................. 257/345, 257/355, 328, 360, 173, 546, E29.012; 438/142, 438/197, 218, 221, 225, 294, 296–298
See application file for complete search history.

(56) References Cited

U.S. PATENT DOCUMENTS

| | | | |
|---|---|---|---|
| 5,846,866 A | 12/1998 | Huang et al. | 438/306 |
| 5,856,241 A | 1/1999 | Narita | 438/758 |
| 6,211,552 B1 | 4/2001 | Efland et al. | 257/343 |
| 6,262,459 B1 | 7/2001 | Tung | 257/389 |
| 6,399,468 B2* | 6/2002 | Nishibe et al. | 438/592 |
| 6,424,005 B1 | 7/2002 | Tsai et al. | 257/335 |
| 6,498,357 B2 | 12/2002 | Ker et al. | 257/173 |
| 6,531,355 B2 | 3/2003 | Mosher et al. | 438/227 |
| 6,806,160 B2 | 10/2004 | Ker et al. | 438/371 |
| 7,420,255 B2 | 9/2008 | Shimizu | 257/409 |
| 7,635,621 B2* | 12/2009 | McCormack et al. | 438/202 |
| 2003/0151088 A1 | 8/2003 | Chen et al. | 257/328 |
| 2004/0033666 A1 | 2/2004 | Williams et al. | 438/297 |
| 2005/0253216 A1 | 11/2005 | Tsuchiko | 257/491 |
| 2006/0145285 A1 | 7/2006 | Lee | 257/492 |
| 2006/0189081 A1 | 8/2006 | Hsu et al. | 438/268 |
| 2007/0034897 A1* | 2/2007 | Kim | 257/173 |
| 2007/0045767 A1 | 3/2007 | Zhu et al. | 257/505 |
| 2008/0197410 A1* | 8/2008 | Chiang et al. | 257/342 |

FOREIGN PATENT DOCUMENTS
TW I265632 11/2006

* cited by examiner

*Primary Examiner* — Telly Green
(74) *Attorney, Agent, or Firm* — J.C. Patents

(57) ABSTRACT

A lateral-double diffused MOS device is provided. The device includes: a first well having a first conductive type and a second well having a second conductive type disposed in a substrate and adjacent to each other; a drain and a source regions having the first conductive type disposed in the first and the second wells, respectively; a field oxide layer (FOX) disposed on the first well between the source and the drain regions; a gate conductive layer disposed over the second well between the source and the drain regions extending to the FOX; a gate dielectric layer between the substrate and the gate conductive layer; a doped region having the first conductive type in the first well below a portion of the gate conductive layer and the FOX connecting to the drain region. A channel region is defined in the second well between the doped region and the source region.

8 Claims, 4 Drawing Sheets

LOW ON-RESISTANCE LATERAL DOUBLE-DIFFUSED MOS DEVICE

CROSS-REFERENCE TO RELATED APPLICATION

This application is a divisional of and claims the priority benefit of U.S. application Ser. No. 11/767,205, filed on Jun. 22, 2007, now allowed. The entirety of the above-mentioned patent applications is hereby incorporated by reference herein and made a part of this specification.

BACKGROUND OF THE INVENTION

1. Field of the Invention

The present invention relates to an integrated circuit and a method of fabricating the same, and more particularly, to a lateral double-diffused metal oxide semiconductor (LDMOS) device and a method of fabricating the same.

2. Description of Related Art

A lateral double-diffused metal oxide semiconductor (LDMOS) device is a typical high voltage device and the process of fabricating the same can be integrated with the process of fabricating complementary metal oxide semiconductor (CMOS) to fabricate control, logic and power switches on a single chip. When operating a LDMOS device, a high breakdown voltage and a low on-state resistance ($R_{on}$) must be provided. The LDMOS device with a high breakdown voltage and a low on-state resistance ($R_{on}$) has a comparatively lower power consumption when being operated under high voltage. Further, a lower on-state resistance ($R_{on}$) allows a higher drain current when the transistor is saturated to improve the operating speed of the device.

When operating the LDMOS device, the gate dielectric layer is punched through by the hot electrons due to the high electric field and high currents in the drain terminal, affecting the life time of the device. A typical LDMOS device forms a field oxide layer in drain terminal to improve the lifetime of the device. However, the formation of a field oxide layer increases the on-state resistance ($R_{on}$), but decreases the saturation current.

SUMMARY OF THE INVENTION

The present invention is directed to a lateral double-diffused metal oxide semiconductor (LDMOS) device adapted to reduce the on-state resistance ($R_{on}$) and increase the saturation current and a method of fabricating the same.

The present invention provides a lateral double-diffused metal oxide semiconductor (LDMOS) device. This device includes a first well having a first conductive type, a second well having a second conductive type, a first doped region having a first conductive type, a second doped region having a first conductive type, a gate dielectric layer, a gate conductive layer and a third doped region having a first conductive type. The first well and the second well are disposed in the substrate and are adjacent to each other. The first doped region is disposed in the first well. The second doped region is disposed in the second well. The gate conductive layer is disposed on the second well between the second doped region and the first doped region. The gate dielectric layer is disposed between the gate conductive layer and the substrate. The third doped region is disposed in the first well below a portion of the gate conductive layer and is connected to the first doped region. Herein, the second well between the third doped region and the second doped region below the gate dielectric layer defines a channel region.

According to an embodiment of the present invention, the dopant concentration of the third doped region is lower than that of the second doped region or that of the first doped region.

According to an embodiment of the present invention, the distance between the bottom of the third doped region and the surface of the substrate is greater than the distance between the bottom of the first doped region and the surface of the substrate.

According to an embodiment of the present invention, the first conductive type is n-type and the second conductive type is p-type.

According to another embodiment of the present invention, the first conductive type is p-type and the second conductive type is n-type.

According to an embodiment of the present invention, the third doped region further extends to a portion of the second well.

According to an embodiment of the present invention, a field oxide layer is further disposed on a portion of the third doped region between the second doped region and the first doped region.

According to an embodiment of the present invention, the gate conductive layer further covers a portion of the field oxide layer.

According to an embodiment of the present invention, the first doped region is a drain region and the second doped region is a source region.

The LDMOS device of the present invention can reduce on-state resistance ($R_{on}$) and increase the saturation current.

In order to the make the aforementioned and other objects, features and advantages of the present invention more comprehensible, preferred embodiments accompanied with figures are described in detail below.

DESCRIPTION OF EMBODIMENTS

Figure 1:
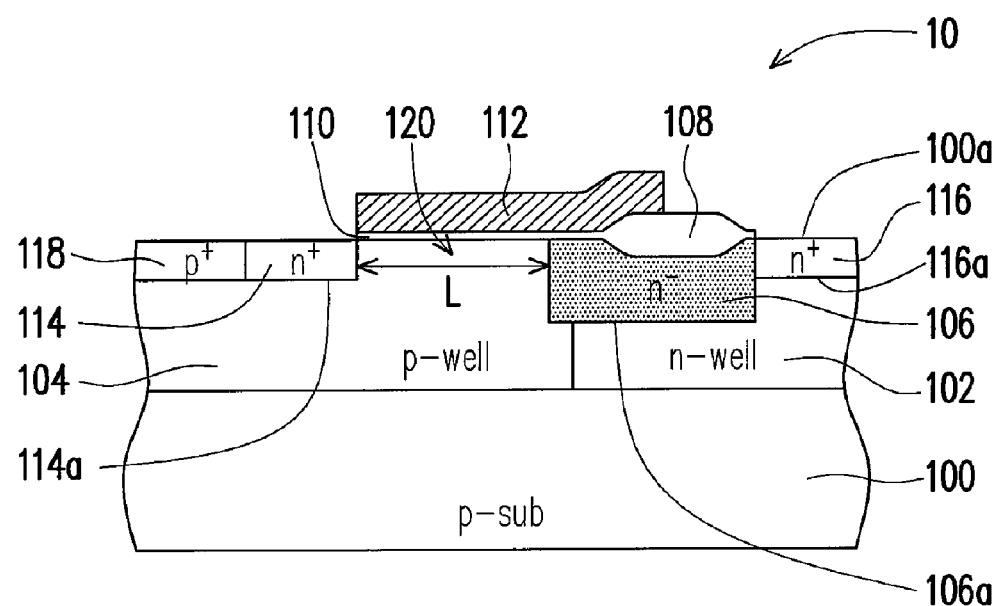
FIG. 1 is a schematic view illustrating a lateral double-diffused metal oxide semiconductor device according to one embodiment of the present invention.

Referring to FIG. 1, a lateral double-diffused metal oxide semiconductor (LDMOS) device 10 includes a first well 102 having a first conductive type such as n-type, a second well 104 having a second conductive type such as p-type, an third doped region 106 having the first conductive type such as n-type, a field oxide layer 108, an first doped region 116 having the first conductive type such as n-type as a drain region, an second doped region 114 having the first conductive type such as n-type as a source region, a gate dielectric layer 110, a gate conductive layer 112 and a bulk contact region 118 having the second conductive type such as p-type.

The first well 102 and the second well 104 are disposed in a substrate 100 and are adjacent to each other. The method used for fabricating the first well 102 and the second well 104 is respectively forming a photoresist pattern using an ion implantation process and a drive-in process.

The source region 114 is disposed in the second well 104. The drain region 116 is disposed in the first well 102. The method for fabricating the source region 114 and the drain region 116 can be forming a photoresist pattern on the substrate 100 using an ion implantation process.

The field oxide layer 108 is disposed on the first well 102 between the source region 114 and the drain region 116. The field oxide layer 108 can be formed by using a local oxidation process. In one embodiment of the present invention, the field oxide layer 108 and the drain region 116 are connected.

The gate dielectric layer 110 is disposed over the second well 104 between the source region 114 and the field oxide layer 108, and over the first well 102. A channel region 120 is defined in the second well 104 between the third doped region 106 below the gate dielectric layer 110 and the source region 114. The distance L between the third doped region 106 and the source region 114 is the length of the channel region 120. The material used for fabricating the gate dielectric layer 110 is, for example, silicon oxide, and the method used for fabricating the same is, for example, a thermal oxidation process.

The gate conductive layer 112 covers the gate dielectric layer 110 and extends to a portion of the field oxide layer 108. The material used for fabricating the gate conductive layer 112 is, for example, doped polysilicon, and the method used for fabricating the same is, for example, forming a layer of doped polysilicon using a chemical vapor deposition process and patterning the same using a photolithography process and an etching process.

The third doped region 106 is disposed in the first well 102 below a portion of the gate conductive layer 112 and the field oxide layer 108, connecting to the drain region 116. The dopant concentration of the third doped region 106 is lower than that of the source region 114 or that of the drain region 116. Further, the distance between the bottom 106a of the third doped region 106 and the surface 100a of the substrate 100 is larger than the distance between the bottom 114a of the source region 114 or the bottom 116a of the drain region 116 and the surface 100a of the substrate 100. In an embodiment of a 0.5 μm logic process, the depth of the third doped region 106 is approximately 0.4-0.5 μm. The depth of the source region 114 and the drain region 116 is approximately 0.1 μm. In one embodiment, the third doped region 106 further extends to a portion of the second well 104. The method used for fabricating the third doped region 106 can be adopted by forming a photoresist pattern on the substrate 100 using an ion implantation process.

The p-type bulk contact region 118 is disposed in the second well 104 and is adjacent to the source region 114. The method used for forming the p-type bulk contact region 118 can be adopted by forming a photoresist pattern on the substrate 100 and performing an ion implantation process.

The third doped region having a low dopant concentration below the field oxide layer 108 can decrease the on-state resistance, resulting in a higher drain current when the transistor is saturated. As a result, the operating speed of the device is increased. Theoretically, the higher dopant concentration the third doped region is, the lower on-state resistance is. However, the higher dopant concentration the third doped region is, the worse breakdown voltage is. Therefore, the lower dopant concentration of the third doped region than the first and second doped regions is satisfied in both lower on-state resistance and better breakdown voltage.

The above-mentioned LDMOS device can be fabricated using different kinds of fabrication methods. The following is an embodiment of the present invention. However, the present invention is not limited thereto.

FIGS. 2A through 2E are schematic cross-sectional views illustrating a method of fabricating a lateral double-diffused semiconductor device according to one embodiment of the present invention.

Figure 2A:
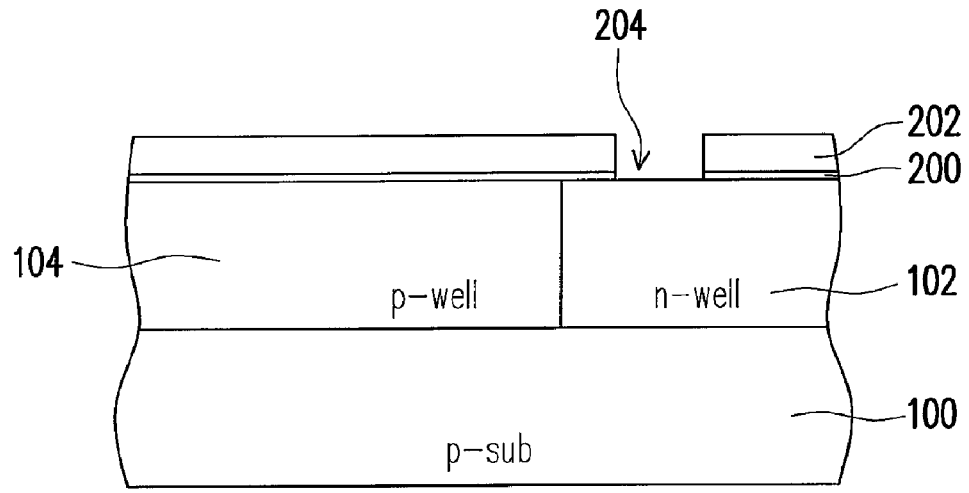
FIGS. 2A through 2E are schematic cross-sectional views illustrating a method of fabricating a lateral double-diffused semiconductor device according to one embodiment of the present invention.

Referring to FIG. 2A, an first well 102 having n-type and a second well 104 having p-type are formed in a p-type substrate 100. The method used for fabricating the first well 102 and the second well 104 can be adopted by forming a photoresist pattern, followed by performing an n-type ion implantation process and a p-type ion implantation process to implant n-type dopants and p-type dopants into the substrate 100 respectively. Thereafter, a drive-in process is performed to complete the fabrication. In one embodiment, the ions used for the n-type ion implantation process is, for example, phosphorus or arsenic. The ions used for the p-type ion implantation process is, for example, boron. In one embodiment of a 0.5 μm logic process, the dopant concentration for the n-type ion implantation process and the p-type ion implantation process is, for example, $1\times10^{12}\sim9\times10^{13}/cm^2$.

Next, a pad oxide layer 200 having an opening 204 and a mask layer 202 having the opening 204 are formed on a substrate 100 to expose the surface of the substrate 100 predetermined for the formation of the field oxide layer. The material used for fabricating the pad oxide layer 200 is, for example, silicon oxide, and the method used for fabricating the same is, for example, a thermal oxidation process. The material used for fabricating the mask layer 202 is, for example, silicon nitride, and the method used for fabricating the same is, for example, a chemical vapor deposition process. After the silicon oxide layer and the silicon nitride layer are formed, a photolithography process and an etching process can be used to pattern the opening 204.

Figure 2B:
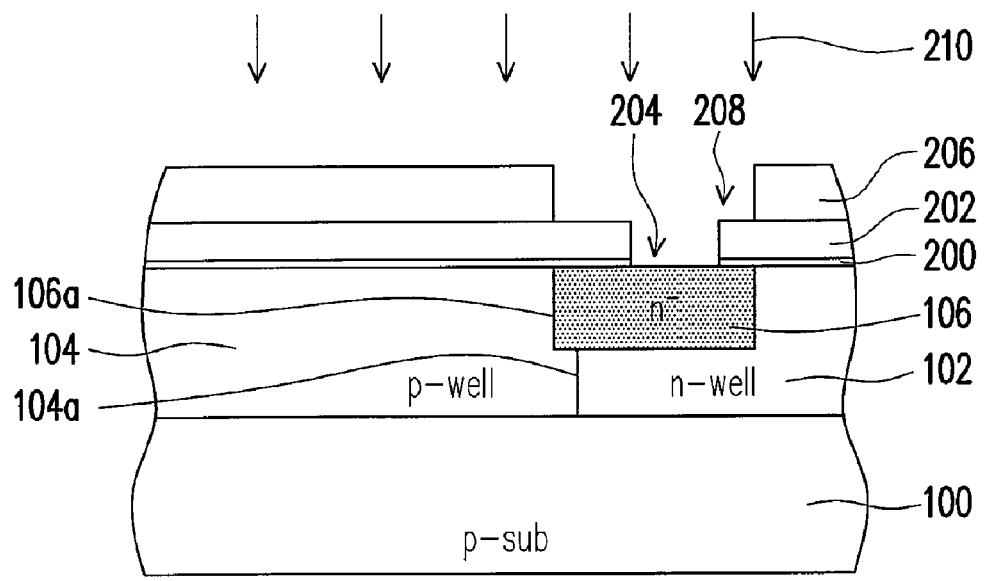

Referring to FIG. 2B, a photoresist layer 206 having an opening 208 is formed on the mask layer 202. The size of the opening 208 is larger than that of the opening 204. Further the opening 208 exposes the surface of the substrate 102 exposed by the opening 204 and a portion of the mask layer 202. Thereafter, an ion implantation process 210 is performed to form a doped region 106 having n-type in the first well 102 using the photoresist layer 206 as a mask. In one embodiment of a 0.5 μm logic process, the ion implanted by the ion implantation process 210 is, for example, phosphorous or arsenic, and the dopant concentration is $1\times10^{11}\sim9\times10^{12}/cm^2$.

In one embodiment, the size and location of the opening 208 in the photoresist layer 206 is critical in ensuring the border 106a of the subsequently formed doped region 106 and the border 104a of the subsequently formed second well 104 are adjacent to each other. Alternately, in another embodiment, the size and location of the opening 208 in the photoresist layer 206 is critical in ensuring the subsequently formed doped region 106 extends from the border 106a of the first well 102 to the second well 104 to connect the first well 102 and the second well 104 through the doped region 106, thus compensating for the problem of electric field or reliability in the spacer caused by misalignment between the first well 102 and the second well 104.

Since, the photoresist layer 206 is formed on the mask layer 202, the alignment for the exposure process performed to the photoresist layer 206 is easier compared to that when the photoresist layer is directly formed on the substrate. In other words, it is easier to control the location of the opening 208 in the photoresist layer 206.

Figure 2C:
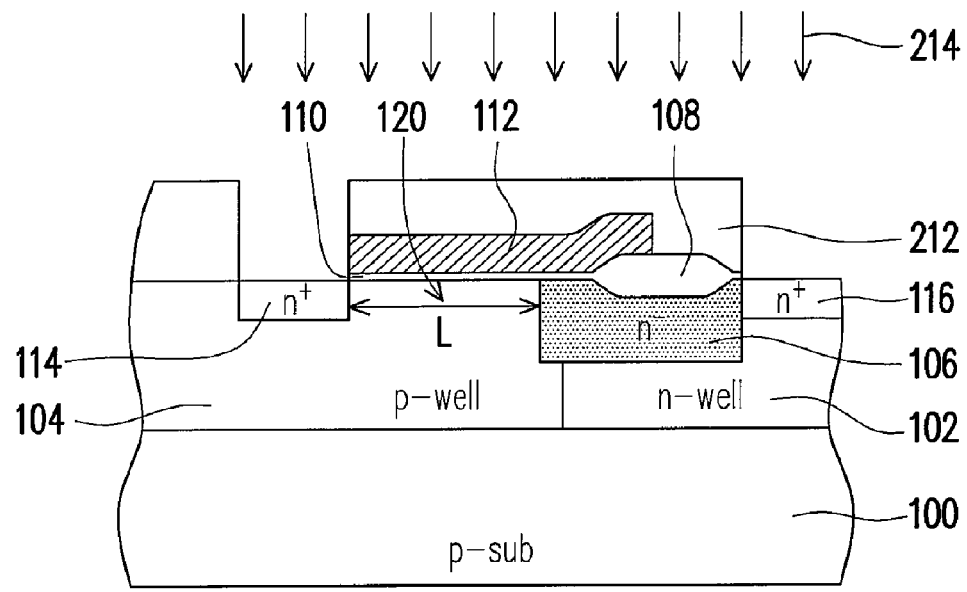

Referring to FIG. 2C, the photoresist layer 206 is removed. Next, a local oxidation process is performed to form a field oxide layer 108 over a portion of the third doped region 106 in the substrate 100 exposed by the opening 208.

Thereafter, the mask layer 202 and the pad oxide layer 200 are removed. The method used for removing the mask layer 202 can be a wet etching process. For example, a hot phosphoric acid can be used to remove the mask layer 202 and a hydrofluoric acid can be used to etch and remove the pad oxide layer 200. Afterward, a gate dielectric layer 110 and a gate conductive layer 112 are formed on the substrate 100. The material used for fabricating the gate dielectric layer 110 is, for example, silicon oxide, and the method used for fabricating the same is, for example, a thermal oxidation process. The material used for fabricating the gate conductive layer 112 is, for example, doped polysilicon, and the method used for fabricating the same is, for example, a chemical vapor deposition process. The method used for fabricating the two layers is, for example, forming a silicon oxide layer and a doped polysilicon layer on the substrate 100, followed by performing a lithography process and an etching process to pattern the layers.

Subsequently, a photoresist layer 212 is formed on the substrate 100 and an n-type ion implantation process 214 is performed to respectively form a source region 114 having n-type and a drain region 116 having n-type in the substrate 100. The source region 114 is disposed in the second well 104 beside the gate conductive layer 112. The drain region 116 is disposed in the first well and is adjacent to the doped region 106. In one embodiment, the ions used for the n-type ion implantation process 214 used is, for example, phosphorus or arsenic, and the dopant concentration is $1 \times 10^{13} \sim 1 \times 10^{15}/cm^2$.

Figure 2D:
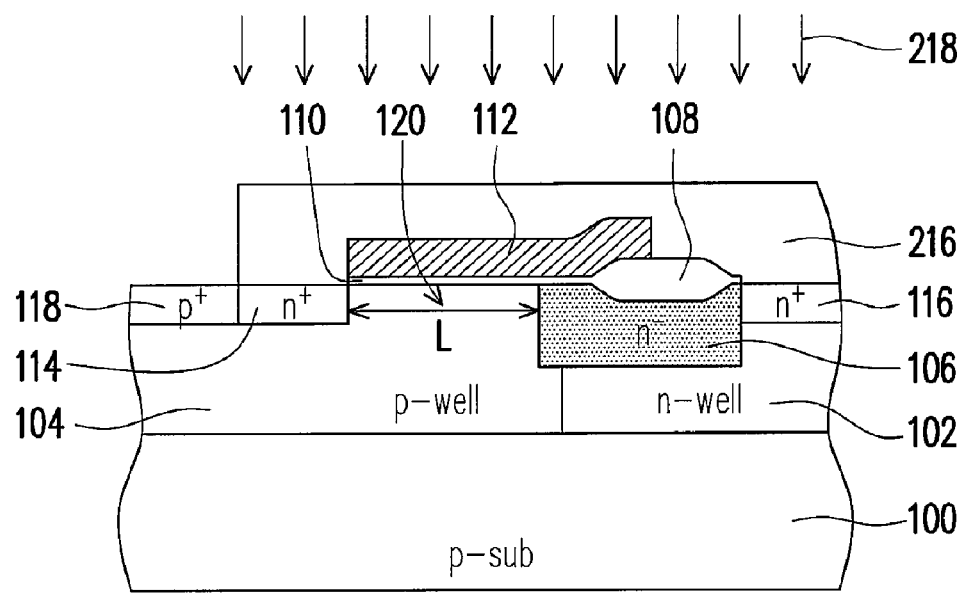
Figure 2E:
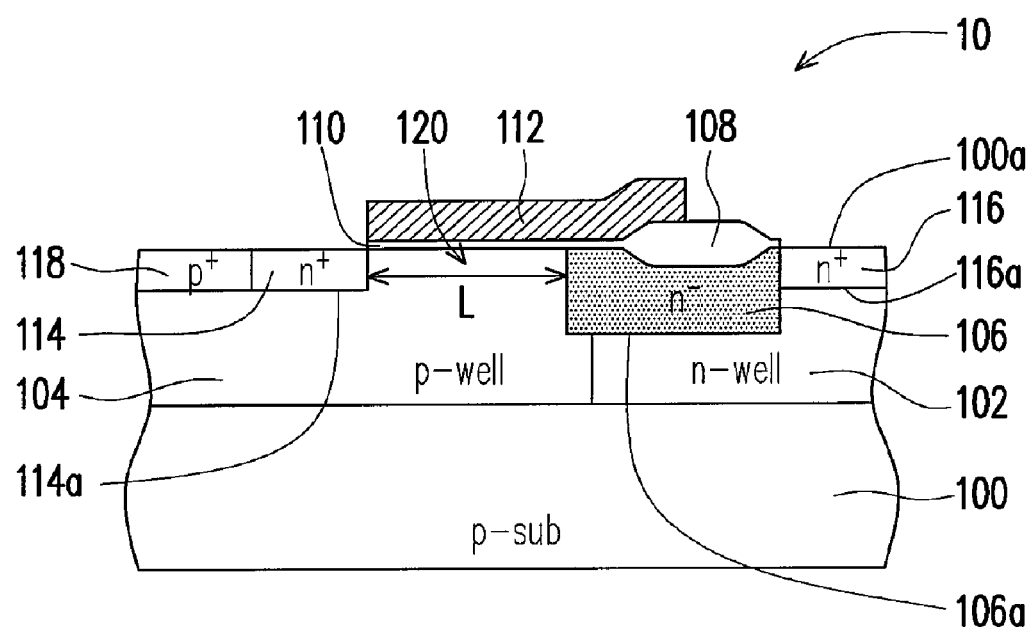

Referring to FIG. 2D, the photoresist layer 212 is removed and another photoresist layer 216 is formed on the substrate 100. Next, a p-type ion implantation process 218 is performed to form a bulk contact region 118 that is adjacent to the source region 114 in the second well 104. The ions used for the p-type ion implantation process 218 are, for example, boron.

In the aforementioned fabrication method, the doped region 106 and the field oxide layer 108 are defined using different photomaks and photoresist layers instead of using the same photomask and the same photoresist layer. Therefore, the location of the doped region 106 is not limited by the field oxide layer 108.

Further, according to the fabrication method in the present embodiment, the mask layer 202 used to define the field oxide layer 108 is formed first, followed by forming the photoresist layer 206 used to define the location of the-doped region 106 on the mask layer 202. Hence, the exposure process to the photoresist layer 206 is easier to align compared to that when forming the photoresist layer is directly formed on the substrate. In other words, the location of the opening 208 in the photoresist layer 206 is easier to control. Further, the doped region 106 is formed on the predetermined location. Hence, the fabrication process according to the present invention can precisely control the length of the channel region 120 between the source region 114 and the doped region 106, ensuring the electrical property of the device is consistent.

In the above embodiment, the LDMOS device is illustrated using the n-type first well, the p-type second well, the n-type doped region, the field oxide layer, the n-type drain region, the n-type source region, the gate dielectric layer, the gate conductive layer, and the p-type bulk contact region. However, the present invention is not limited thereto. The present invention can also be suitable for a LDMOS having a p-type first well, an n-type second well, a p-type doped region, a field oxide layer, a p-type drain region, a p-type source region, a gate dielectric layer, a gate conductive layer, and an n-type bulk contact region.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A lateral double-diffused metal oxide semiconductor (LDMOS) device, comprising:
    a first well having a first conductive type disposed in a substrate having a second conductive type;
    a second well having a second conductive type disposed in the substrate and is adjacent to the first well;
    a first doped region having the first conductive type disposed in the first well;
    a second doped region having the first conductive type disposed in the second well;
    a field oxide layer disposed in the first well between the second doped region and the first doped region;
    a gate conductive layer disposed on the second well between the second doped region and the first doped region;
    a gate dielectric layer disposed between the gate conductive layer and the substrate; and
    a third doped region having the first conductive type disposed in the first well below a portion of the gate conductive layer, connected to the first doped region, and extending into a portion of the second well, and not extending to a bottom of the doped region, wherein the second well between the third doped region below the gate dielectric layer and the second doped region defines a channel region.

2. The LDMOS device of the claim 1, wherein the dopant concentration of the third doped region is lower than that of the second doped region or the first doped region.

3. The LDMOS device of the claim 1, wherein the distance between the bottom of the third doped region and the surface of the substrate is greater than the distance between the bottom of the first doped region and the surface of the substrate.

4. The LDMOS device of the claim 1, wherein the first conductive type is n-type and the second conductive type is p-type.

5. The LDMOS device of the claim 1, wherein the first conductive type is p-type and the second conductive type is n-type.

6. The LDMOS device of the claim 1, further comprising a field oxide layer disposed on a portion of the third doped region between the second doped region and the first doped region.

7. The LDMOS device of the claim 6, wherein the gate conductive layer further covers a portion of the field oxide layer.

8. The LDMOS device of the claim 6, wherein the first doped region is a drain region and the second doped region is a source region.

* * * * *